US012777862B2

(12) United States Patent
Nakane et al.

(10) Patent No.: US 12,777,862 B2
(45) Date of Patent: Oct. 27, 2026

(54) SUBSTRATE PROCESSING METHOD AND SUBSTRATE PROCESSING APPARATUS

(71) Applicant: Tokyo Electron Limited, Tokyo (JP)

(72) Inventors: Yuta Nakane, Kurokawa-gun (JP); Sho Kumakura, Kurokawa-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 215 days.

(21) Appl. No.: 18/397,020

(22) Filed: Dec. 27, 2023

(65) Prior Publication Data

US 2024/0128092 A1 Apr. 18, 2024

Related U.S. Application Data

(63) Continuation of application No. PCT/JP2022/026372, filed on Jun. 30, 2022.

(30) Foreign Application Priority Data

Jul. 5, 2021 (JP) ................................ 2021-111618

(51) Int. Cl.
*H10P 50/20* (2026.01)
*H10P 50/00* (2026.01)
*H10P 50/26* (2026.01)
*H10P 76/40* (2026.01)

(52) U.S. Cl.
CPC ............ *H10P 50/71* (2026.01); *H10P 50/267* (2026.01); *H10P 76/4085* (2026.01)

(58) Field of Classification Search
CPC ....... H10P 50/28; H10P 50/263; H10P 50/266
See application file for complete search history.

(56) References Cited

U.S. PATENT DOCUMENTS

| | | | | |
|---|---|---|---|---|
| 2006/0166106 | A1 | 7/2006 | Chandrachood et al. | |
| 2017/0365478 | A1 | 12/2017 | George et al. | |
| 2018/0138405 | A1* | 5/2018 | McKerrow | C23C 16/4554 |
| 2018/0182597 | A1* | 6/2018 | Blomberg | H01J 37/32009 |
| 2019/0214296 | A1* | 7/2019 | Wang | H01L 21/76814 |

(Continued)

FOREIGN PATENT DOCUMENTS

| | | | |
|---|---|---|---|
| JP | 2006-209128 | A | 8/2006 |
| JP | 2011142248 | A | 7/2011 |
| JP | 2011-190490 | A | 9/2011 |

(Continued)

OTHER PUBLICATIONS

International Search Report and Written Opinion mailed on Aug. 16, 2022, received for PCT Application PCT/JP2022/026372, filed on Jun. 30, 2022, 12 pages including English Translation.

*Primary Examiner* — Thomas T Pham
(74) *Attorney, Agent, or Firm* — XSENSUS LLP

(57) ABSTRACT

In one exemplary embodiment, a substrate processing method includes: (a) providing a substrate including a metal-containing film and a mask provided on the metal-containing film; (b) forming a protective film on the mask; and (c) etching the metal-containing film after (b). (c) includes (c1) forming a second metal-containing substance from a first metal-containing substance contained in the metal-containing film by using a first processing gas including a fluorine-containing gas, and (c2) removing the second metal-containing substance by using a second processing gas including a precursor.

20 Claims, 14 Drawing Sheets

(56) References Cited

U.S. PATENT DOCUMENTS

2020/0251346 A1* 8/2020 Guo ...................... H10P 50/283

FOREIGN PATENT DOCUMENTS

| | | | |
|---|---|---|---|
| JP | 2016-021546 | A | 2/2016 |
| JP | 2017059824 | A | 3/2017 |
| JP | 2018-500767 | A | 1/2018 |
| JP | 2018-026566 | A | 2/2018 |
| JP | 2019-519918 | A | 7/2019 |
| JP | 2020-508579 | A | 3/2020 |
| TW | 201724254 | A | 7/2017 |
| WO | 2011121166 | A1 | 10/2011 |
| WO | 2016/100873 | A1 | 6/2016 |
| WO | 2017/205614 | A1 | 11/2017 |
| WO | 2018/157090 | A1 | 8/2018 |

* cited by examiner

SUBSTRATE PROCESSING METHOD AND SUBSTRATE PROCESSING APPARATUS

CROSS-REFERENCE TO RELATED APPLICATIONS

This application is a continuation application of PCT Application No. PCT/JP2022/026372, filed on Jun. 30, 2022, which claims the benefit of priority from Japanese Patent Application No. 2021-111618, filed on Jul. 5, 2021. The entire contents of the above listed PCT and priority applications are incorporated herein by reference.

BACKGROUND

Field

Exemplary embodiments of the present disclosure relate to a substrate processing method and a substrate processing apparatus.

Description of the Related Art

Japanese Unexamined Patent Publication No. 2018-26566 discloses an atomic layer etching (ALE) method. In this method, a substrate is exposed to a hydrogen fluoride gas to form a fluorinated surface layer on a metal oxide film. Then, the substrate is exposed to a boron-containing gas to remove the fluorinated surface layer from the metal oxide film.

SUMMARY

In one exemplary embodiment, a substrate processing method is provided. The method includes: (a) providing a substrate including a metal-containing film and a mask provided on the metal-containing film; (b) forming a protective film on the mask; and (c) etching the metal-containing film after (b), and (c) includes (c1) forming a second metal-containing substance from a first metal-containing substance contained in the metal-containing film by using a first processing gas including a fluorine-containing gas, and (c2) removing the second metal-containing substance by using a second processing gas including a precursor.

DETAILED DESCRIPTION

Figure 1:
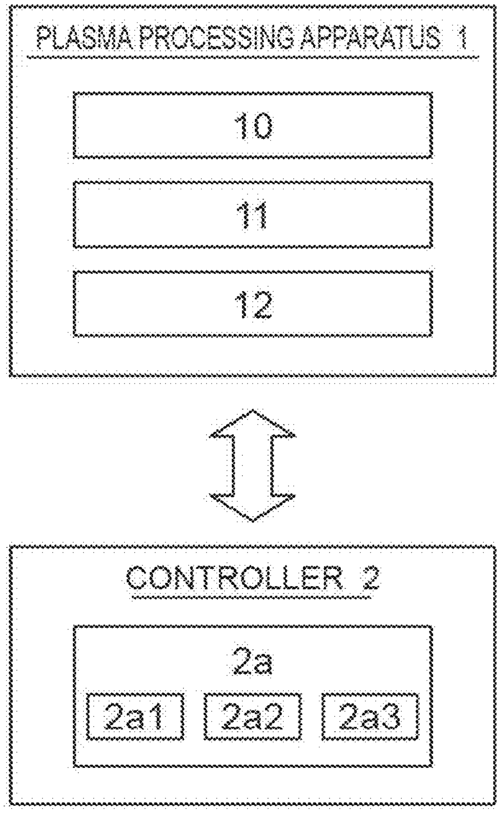
FIG. 1 is a diagram schematically showing a substrate processing apparatus according to one exemplary embodiment.

Hereinafter, various exemplary embodiments will be described.

In one exemplary embodiment, a substrate processing method includes: (a) providing a substrate including a metal-containing film and a mask provided on the metal-containing film; (b) forming a protective film on the mask; and (c) etching the metal-containing film after (b), and (c) includes (c1) forming a second metal-containing substance from a first metal-containing substance contained in the metal-containing film by using a first processing gas including a fluorine-containing gas, and (c2) removing the second metal-containing substance by using a second processing gas including a precursor.

In the method of the embodiment, etching of the mask is suppressed by the protective film during etching of the metal-containing film. Therefore, the metal-containing film can be selectively etched with respect to other films.

The substrate processing method may further include (d) removing fluorine on a surface of the protective film by using a third processing gas after (c). In this case, a further protective film can be then formed in a short time.

The substrate processing method may further include (e) repeating (b), (c), and (d) after (d). In this case, the etching depth of the metal-containing film can be increased.

In (b), the thickness of the protective film formed on a side surface of the mask may decrease toward the metal-containing film from the upper surface of the mask. In this case, since the thickness of the protective film formed on the metal-containing film is reduced, the etching rate of the metal-containing film is improved.

In (d), plasma generated from the third processing gas is used and the third processing gas may include at least one of an oxygen-containing gas, a hydrogen-containing gas, or a nitrogen-containing gas.

The protective film may contain at least one of silicon, carbon, or metal.

In (c1), the first processing gas may be used without generating plasma.

In (c1), plasma generated from the first processing gas may be used.

The substrate may be heated in at least one of (c1) or (c2). In this case, the reaction between the first metal-containing substance and the fluorine-containing gas or the reaction between the second metal-containing substance and the precursor is accelerated.

The precursor may include a metal-containing precursor. In this case, the metal-containing precursor can react with the second metal-containing substance with low energy.

The metal-containing precursor may include a metal complex. In this case, another highly volatile metal complex is generated by a ligand exchange reaction between the second metal-containing substance and the metal complex.

The metal complex may be a complex including at least one monodentate ligand selected from the group consisting of an alkyl, a hydride, a carbonyl, a halide, an alkoxide, an alkylamide, and a silylamide, or at least one chelate selected from the group consisting of β-diketonate, amidinate, acetamidinate, β-diketiminate, diaminoalkoxide, and metallocene.

The metal contained in the metal-containing precursor may be at least one selected from the group consisting of Sn, Ge, Al, B, Ga, In, Zn, Ni, Pb, Si, Hf, Zr, and Ti.

The precursor may include a metal-free precursor. In this case, metal residue due to the reaction between the second metal-containing substance and the precursor is hardly generated.

The metal-free precursor may be at least one β-diketone selected from the group consisting of acetylacetone (acac), hexafluoroacetylacetone (hfac), trifluoroacetylacetone (tfac), and tetramethylheptanedione (tmhd).

The metal-containing film may contain at least one metal selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, and Sn.

The metal-containing film may be an oxide or a nitride of the metal.

The fluorine-containing gas may include at least one selected from the group consisting of a hydrogen fluoride gas, a fluorocarbon gas, a nitrogen-containing gas, and a sulfur-containing gas.

In one exemplary embodiment, a substrate processing method includes: (a) providing a substrate including a film to be etched and a mask provided on the film to be etched; (b) forming a metal-containing protective film on the mask; (c) removing a part of the metal-containing protective film after (b); and (d) etching the film to be etched after (c), (b) includes (b1) forming a precursor layer on a side surface of the mask by using a first precursor containing a metal, and (b2) modifying the precursor layer into the metal-containing protective film by using a modifying gas including an oxidizing gas or a reducing gas, and (c) includes (c1) forming a second metal-containing substance from a first metal-containing substance contained in the metal-containing protective film by using a first processing gas including at least one of a halogen-containing gas or an oxygen-containing gas, and (c2) removing the second metal-containing substance by using a second processing gas including a second precursor.

In the method of the embodiment, the metal-containing protective film can be etched at a high selectivity with respect to the film to be etched and the mask.

The first precursor may contain at least one metal selected from the group consisting of Ti, Ta, Ru, Al, Hf, and Sn.

The halogen-containing gas may contain at least one selected from the group consisting of fluorine, chlorine, and bromine.

The second precursor may contain a metal including at least one selected from the group consisting of Sn, Ge, Al, B, Ga, In, Zn, Ni, Pb, Si, Hf, Zr, and Ti, or a complex of the metal.

The film to be etched may be a silicon-containing film.

In one exemplary embodiment, a substrate processing apparatus includes: a chamber; a substrate support for supporting a substrate in the chamber, the substrate including a metal-containing film and a mask provided on the metal-containing film; a gas supply configured to supply each of a first processing gas including a hydrogen fluoride gas, a second processing gas including a precursor, a third processing gas, and a fourth processing gas for forming a protective film into the chamber; and a controller, the controller is configured to control the gas supply in order to form the protective film on the mask by using the fourth processing gas, the controller is configured to control the gas supply in order to form a second metal-containing substance from a first metal-containing substance contained in the metal-containing film by using the first processing gas after formation of the protective film, the controller is configured to control the gas supply in order to remove the second metal-containing substance by using the second processing gas after formation of the second metal-containing substance, and the controller is configured to control the gas supply in order to remove fluorine on a surface of the protective film by using the third processing gas after removal of the second metal-containing substance.

According to the substrate processing apparatus of the embodiment, etching of the mask is suppressed by the protective film during etching of the metal-containing film. Therefore, the metal-containing film can be selectively etched with respect to other films Furthermore, the fluorine on the surface of the protective film is removed by using the third processing gas. Therefore, a further protective film can be then formed in a short time.

Hereinafter, various exemplary embodiments will be described in detail with reference to the drawings. In the drawings, the same or corresponding parts are denoted by the same references.

Figure 2:
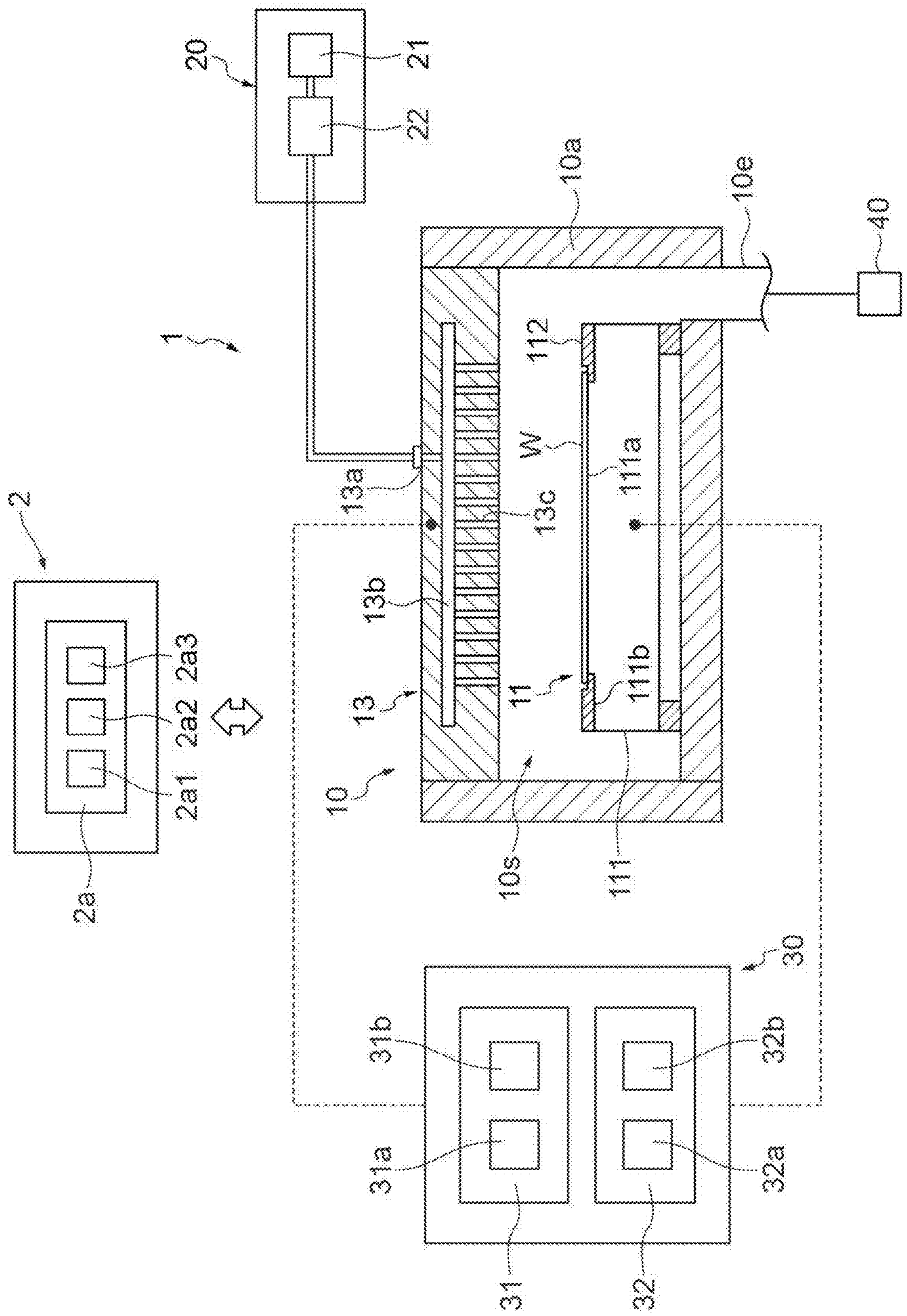
FIG. 2 is a diagram schematically showing the substrate processing apparatus according to one exemplary embodiment.

FIGS. 1 and 2 are diagrams schematically showing the substrate processing apparatus according to one exemplary embodiment. The substrate processing apparatus of the present embodiment is, for example, a plasma processing system.

In one embodiment, the plasma processing system includes a plasma processing apparatus 1 and a controller 2. The plasma processing apparatus 1 includes a plasma processing chamber 10, a substrate support 11, and a plasma generator 12. The plasma processing chamber 10 has a plasma processing space. In addition, the plasma processing chamber 10 has at least one gas supply port for supplying at least one processing gas to the plasma processing space and at least one gas discharge port for discharging the gas from the plasma processing space. The gas supply port is connected to a gas supply 20 to be described later, and the gas discharge port is connected to an exhaust system 40 to be described later. The substrate support 11 is disposed in the plasma processing space and has a substrate support surface for supporting the substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance plasma (ECR plasma), helicon wave plasma (HWP), or surface wave plasma (SWP). In addition, various types of plasma generators may be used, including an alternating current (AC) plasma generator and a direct current (DC) plasma generator. In one embodiment, the AC signal (AC power) used in the AC plasma generator has a frequency in a range of 100 kHz to 10 GHz. Therefore, the AC signal includes a radio frequency (RF) signal and a microwave signal. In one embodiment, the RF signal has a frequency in a range of 200 kHz to 150 MHz.

The controller 2 processes computer-executable instructions that cause the plasma processing apparatus 1 to execute the various steps described in the present disclosure. The controller 2 may be configured to control each element of the plasma processing apparatus 1 to execute the various steps described herein. In one embodiment, a part or the whole of the controller 2 may be included in the plasma processing apparatus 1. The controller 2 may include, for example, a computer 2*a*. The computer 2*a* may include, for example, a central processing unit (CPU) 2*a*1, a storage unit 2*a*2, and a communication interface 2*a*3. The processing unit 2*a*1 may be configured to perform various control operations based on the program stored in the storage unit 2*a*2. The storage unit 2*a*2 may include a random access memory (RAM), a read only memory (ROM), a hard disk drive (HDD), a solid state drive (SSD), or combinations thereof. The communication interface 2*a*3 may be communicated with the plasma processing apparatus 1 through a communication line such as a local area network (LAN).

Hereinafter, a configuration example of the plasma processing system will be described.

The plasma processing system includes a capacitively coupled plasma processing apparatus 1 and a controller 2. The capacitively coupled plasma processing apparatus 1 includes a plasma processing chamber 10, a gas supply 20, a power source 30, and an exhaust system 40. In addition, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10*s* defined by the shower head 13, side walls 10*a* of the plasma processing chamber 10, and the substrate support 11. The plasma processing chamber 10 has at least one gas supply port for supplying at least one processing gas to the plasma processing space 10*s* and at least one gas discharge port for discharging the gas from the plasma processing space. The side wall 10*a* is grounded. The shower head 13 and the substrate support 11 are electrically insulated from the housing of the plasma processing chamber 10.

The substrate support 11 includes a main body 111 and a ring assembly 112. The main body 111 has a central region (substrate support surface) 111*a* for supporting a substrate (wafer) W and an annular region (ring support surface) 111*b* for supporting the ring assembly 112. The annular region 111*b* of the main body 111 surrounds the central region 111*a* of the main body 111 in a plan view. The substrate W is disposed on the central region 111*a* of the main body 111, and the ring assembly 112 is disposed on the annular region 111*b* of the main body 111 to surround the substrate W on the central region 111*a* of the main body 111. In one embodiment, the main body 111 includes a base and an electrostatic chuck. The base includes a conductive member. The conductive member of the base functions as a lower electrode. The electrostatic chuck is disposed on the base. The upper surface of the electrostatic chuck has the substrate support surface 111*a*. The ring assembly 112 includes one or more annular members. At least one of the one or more annular members is an edge ring. In addition, although now shown in the drawing, the substrate support 11 may include a temperature adjusting module configured to adjust at least one of the electrostatic chuck, the ring assembly 112, or the substrate to a target temperature. The temperature adjusting module may include a heater, a heat transfer medium, a flow passage, or combinations thereof. A heat transfer fluid such as brine or gas flows through the flow passage. In addition, the substrate support 11 may include a heat transfer gas supply configured to supply a heat transfer gas to a gap between a rear surface of the substrate W and the substrate support surface 111*a*.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. In addition, the shower head 13 includes a conductive member. The conductive member of the shower head 13 functions as an upper electrode. The gas introduction unit may include one or more side gas injectors (SGI) attached to one or more openings formed in the side wall 10*a*, in addition to the shower head 13.

The gas supply 20 may include at least one gas source 21 and at least one flow rate controller 22. In one embodiment, the gas supply 20 is configured to supply at least one processing gas from each corresponding gas source 21 to the shower head 13 through each corresponding flow rate controller 22. Each flow rate controller 22 may include, for example, a mass flow controller or a pressure control type flow rate controller. Furthermore, the gas supply 20 may include one or more flow rate modulation devices that modulate or pulse the flow rate of at least one processing gas.

The power source 30 includes an RF power source 31 coupled to the plasma processing chamber 10 through at least one impedance matching circuit. The RF power source 31 is configured to supply at least one RF signal (RF power) such as a source RF signal and a bias RF signal to the conductive member of the substrate support 11 and/or the conductive member of the shower head 13. Accordingly, plasma is formed from at least one processing gas supplied to the plasma processing space 10*s*. Therefore, the RF power source 31 may function as at least a part of a plasma generator configured to generate plasma from the one or more processing gases in the plasma processing chamber 10. Further, by supplying a bias RF signal to the conductive member of the substrate support 11, a bias potential is generated in the substrate W and ion components in the formed plasma can be drawn to the substrate W.

In one embodiment, the RF power source 31 includes a first RF generator 31*a* and a second RF generator 31*b*. The first RF generator 31*a* is configured to be coupled to the conductive member of the substrate support 11 and/or the conductive member of the shower head 13 through at least one impedance matching circuit and to generate a source RF signal (source RF power) for plasma generation. In one embodiment, the source RF signal has a frequency in a range of 13 MHz to 150 MHz. In one embodiment, the first RF generator 31*a* may be configured to generate a plurality of source RF signals having different frequencies. The generated one or more source RF signals are supplied to the conductive member of the substrate support 11 and/or the conductive member of the shower head 13. The second RF generator 31*b* is configured to be coupled to the conductive member of the substrate support 11 through at least one impedance matching circuit and to generate a bias RF signal (bias RF power). In one embodiment, the bias RF signal has a lower frequency than the source RF signal. In one embodiment, the bias RF signal has a frequency in a range of 400 kHz to 13.56 MHz. In one embodiment, the second RF generator 31*b* may be configured to generate a plurality of bias RF signals having different frequencies. The generated one or more bias RF signals are supplied to the conductive member of the substrate support 11. Further, in various embodiments, at least one of the source RF signal or the bias RF signal may be pulsed.

In addition, the power source 30 may include a DC power source 32 coupled to the plasma processing chamber 10. The DC power source 32 includes a first DC generator 32*a* and a second DC generator 32*b*. In one embodiment, the first DC generator 32*a* is configured to be connected to the conductive member of the substrate support 11 and to generate a first DC signal. The generated first bias DC signal is applied to the conductive member of the substrate support 11. In one embodiment, the first DC signal may be applied to another electrode such as an electrode in the electrostatic chuck. In one embodiment, the second DC generator 32*b* is connected to the conductive member of the shower head 13 and is configured to generate a second DC signal. The generated second DC signal is applied to the conductive member of the shower head 13. In various embodiments, at least one of the first or second DC signal may be pulsed. The first and second DC generators 32*a* and 32*b* may be provided in addition to the RF power source 31, or the first DC generator 32*a* may be provided in place of the second RF generator 31*b*.

The exhaust system 40 may be connected to, for example, a gas discharge port 10*e* provided in a bottom portion of the plasma processing chamber 10. The exhaust system 40 may include a pressure adjusting valve and a vacuum pump. The pressure in the plasma processing space 10*s* is adjusted by the pressure adjusting valve. The vacuum pump may include a turbo molecular pump, a dry pump, or combinations thereof.

Figure 3:
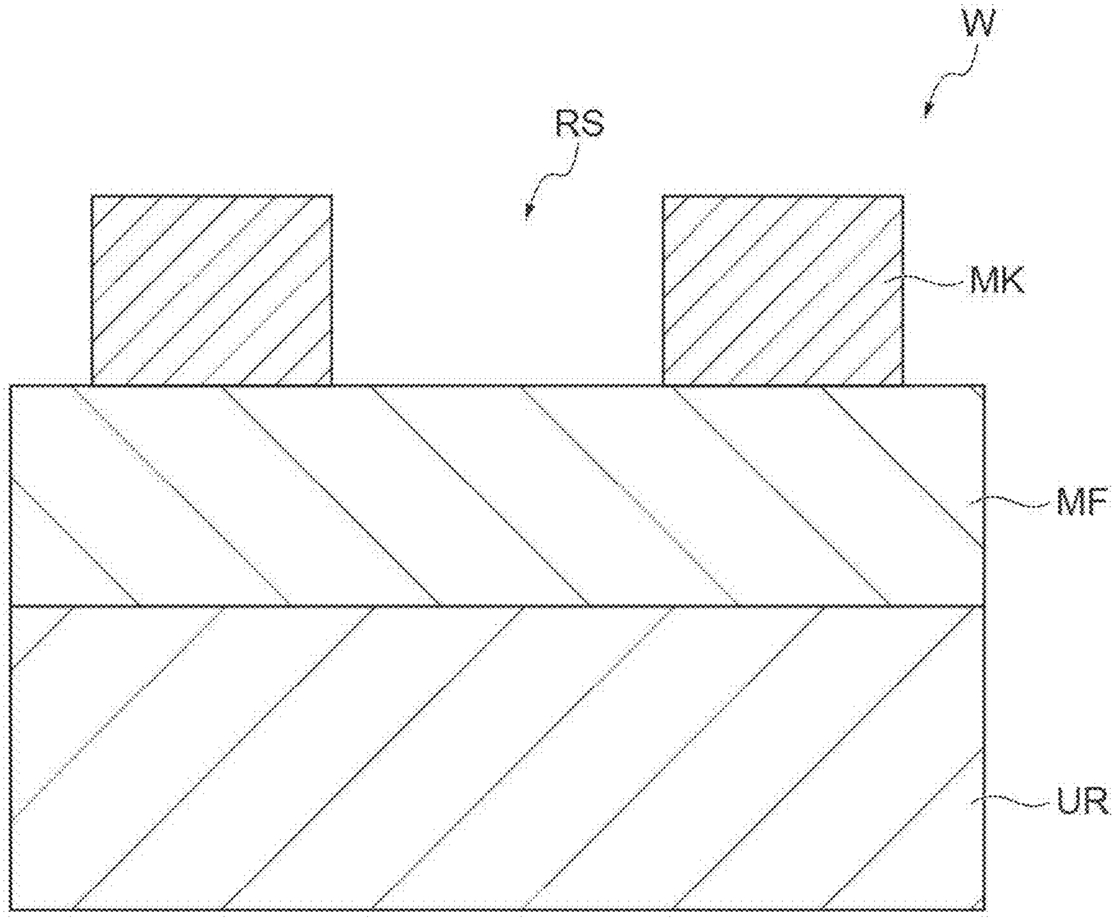
FIG. 3 is a partially enlarged sectional view of an exemplary substrate.

FIG. 3 is a partially enlarged sectional view of an exemplary substrate. As shown in FIG. 3, in one embodiment, the substrate W includes a metal-containing film MF and a mask MK. The mask MK is provided on the metal-containing film MF. The substrate W may include a base region UR. The base region UR may contain silicon. The metal-containing film MF may be provided on the base region UR.

The metal-containing film MF may contain at least one of oxygen or nitrogen. The metal-containing film MF may contain at least one of a metal oxide or a metal nitride. The metal-containing film MF may contain at least one of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, or Sn.

The mask MK may contain silicon. The mask MK may contain at least one of a silicon oxide or a silicon nitride. The mask MK may contain carbon (organic matter). The mask MK may contain at least one of photoresist, spin-on carbon, amorphous carbon, or tungsten carbide. The mask MK may include at least one recess RS. Each recess RS may be an opening.

Figure 4:
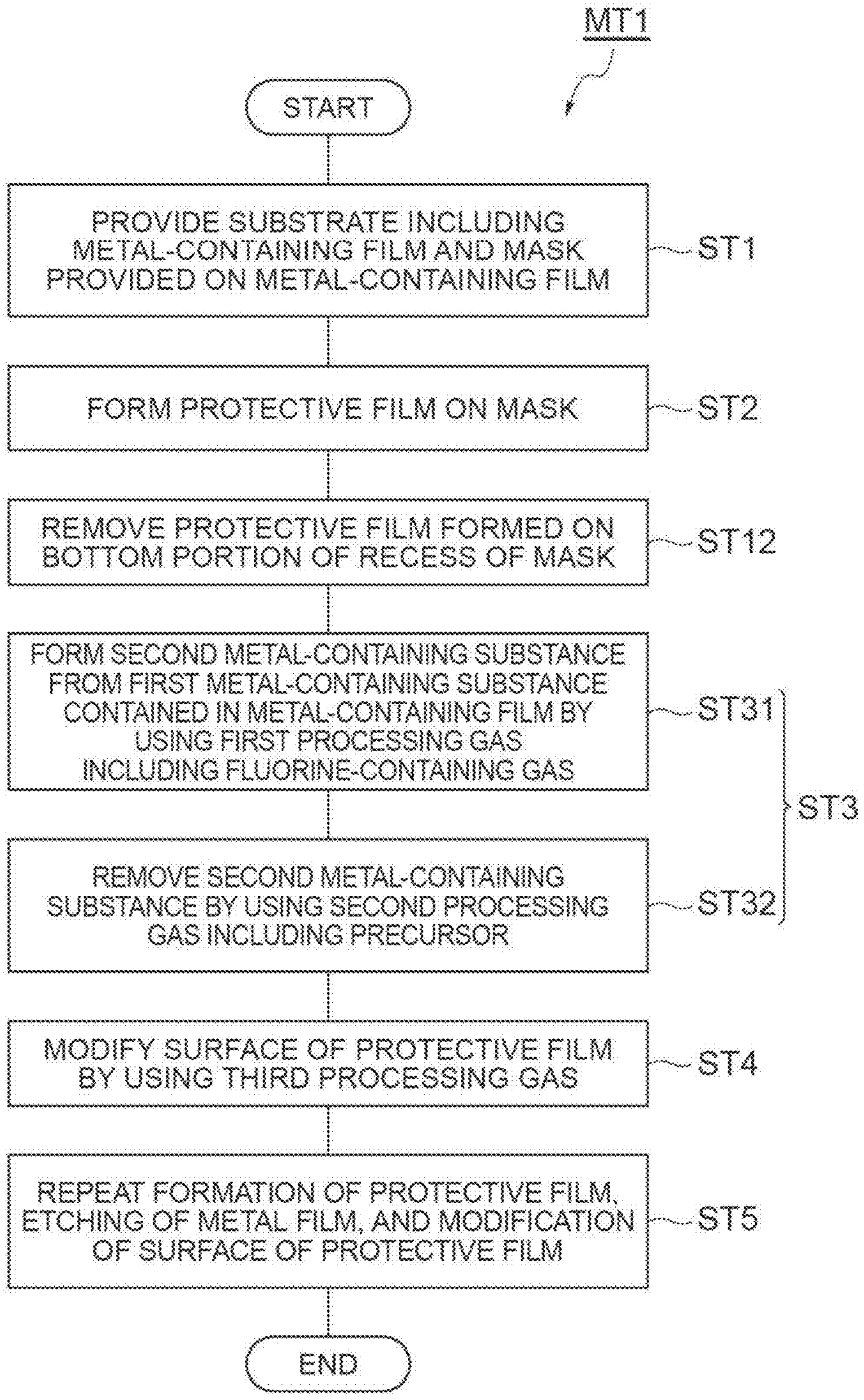
FIG. 4 is a flowchart of a substrate processing method according to one exemplary embodiment.

FIG. 4 is a flowchart of the substrate processing method according to one exemplary embodiment. The substrate processing method shown in FIG. 4 (hereinafter, referred to as "method MT1") may be executed by the substrate processing apparatus of the embodiment. The method MT1 may include Steps ST1 to ST5. Steps ST1 to ST5 may be executed in order. Step ST5 may not be executed.

Hereinafter, the method MT1 will be described with reference to FIGS. 4 to 8. In a case where the plasma processing apparatus 1 is used, the method MT1 may be executed in the plasma processing apparatus 1 under the control of each part of the plasma processing apparatus 1 by the controller 2. In the method MT1, the metal-containing film MF can be etched. Steps ST1 to ST5 may be performed in-situ. That is, the method MT1 may be performed without taking the substrate W out of the plasma processing chamber 10.

(Step ST1)

In Step ST1, the substrate W shown in FIG. 3 is provided. The substrate W may be supported by the substrate support 11 in the plasma processing chamber 10 as shown in FIG. 2.

(Step ST2)

Figure 5:
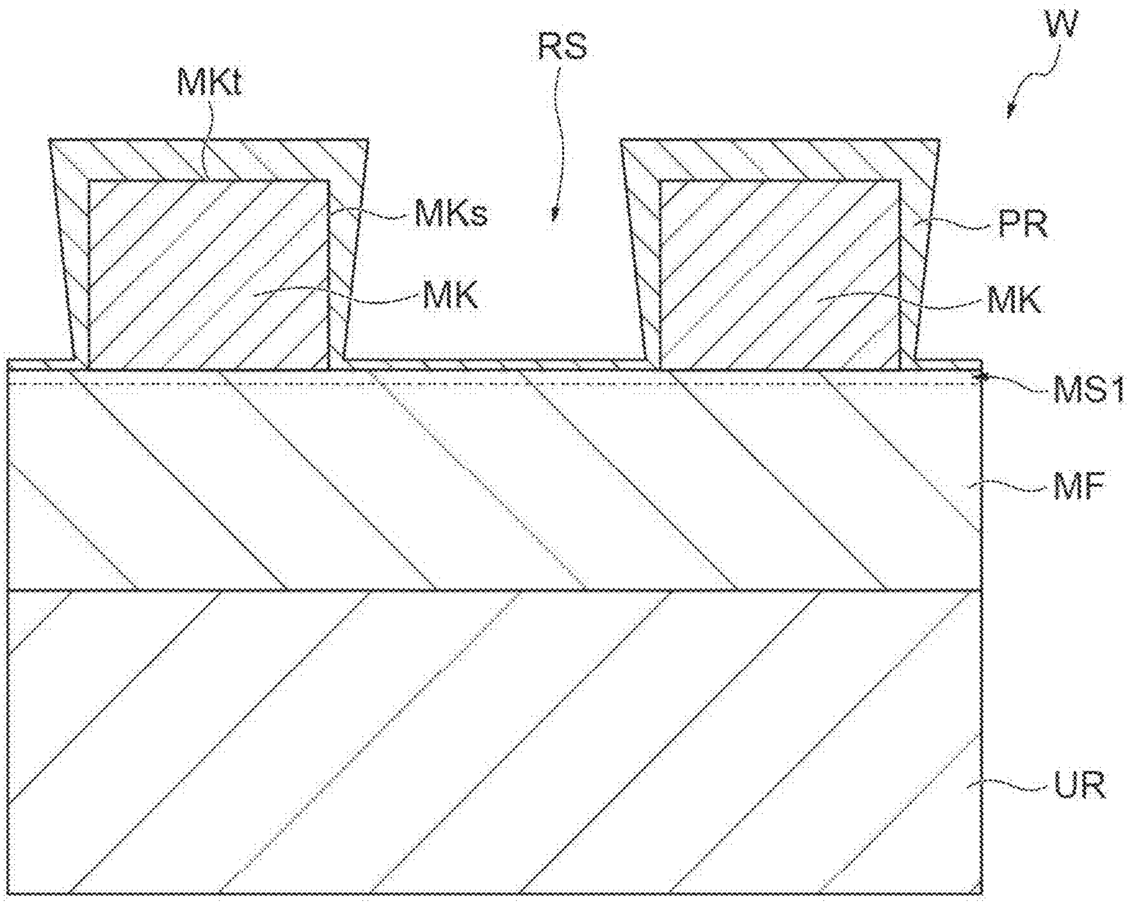
FIG. 5 is a partially enlarged sectional view of the exemplary substrate in forming a protective film on a mask.

FIG. 5 is a partially enlarged sectional view of the exemplary substrate in forming a protective film on a mask. In Step ST2, a protective film PR is formed on the mask MK. The protective film PR may be formed by atomic layer deposition (ALD), molecular layer deposition (MLD), or chemical vapor deposition (CVD). A fourth processing gas may be used to form the protective film PR. The fourth processing gas is supplied from the gas supply 20 into the plasma processing chamber 10. In the plasma processing chamber 10, the substrate W is exposed to the fourth processing gas. In a case where the protective film PR is formed by ALD or MLD, a precursor gas and a modifying gas are used as the fourth processing gas.

The protective film PR may be formed on an upper surface MKt and a side surface MKs of the mask MK. The thickness of the protective film PR formed on the upper surface MKt of the mask MK is larger than the thickness of the protective film PR formed on the side surface MKs of the mask MK. The thickness of the protective film PR formed on the side surface MKs of the mask MK may decrease toward the metal-containing film MF from the upper surface MKt of the mask MK. That is, the protective film PR may be a sub-conformal film. The protective film PR may not be formed on the metal-containing film MF in a bottom portion of a recess RS of the mask MK. The thickness of the protective film PR formed on the bottom portion of the recess RS of the mask MK is smaller than the thickness of the protective film PR formed on the upper surface MKt and the side surfaces MKs of the mask MK.

The protective film PR may be a conformal film. In this case, the protective film PR formed on the bottom portion of the recess RS of the mask MK can be selectively removed by, for example, anisotropic etching. Accordingly, while the protective film PR on the upper surface MKt and the side surface MKs of the mask MK remains, the protective film PR on the bottom portion of the recess RS of the mask MK can be removed.

The protective film PR may contain at least one of silicon, carbon, or metal.

In a case where the protective film PR has a silicon oxide film formed by ALD or MLD, a silicon-containing gas such as aminosilane, $SiCl_4$, or $SiF_4$ is used as the precursor gas, and an oxygen-containing gas such as an oxygen gas may be used as the modifying gas.

In a case where the protective film PR has a silicon nitride film formed by ALD or MLD, a silicon-containing gas such as aminosilane, $SiCl_4$, dichlorosilane, or hexachlorodisilane may be used as the precursor gas. As the modifying gas, a nitrogen-containing gas such as an ammonia gas or a nitrogen gas may be used.

In a case where the protective film PR has an organic film formed by ALD, an epoxide, a carboxylic acid, a carboxylic acid halide, a carboxylic acid anhydride, an isocyanate, phenols, or the like may be used as the precursor gas. As the modifying gas, an inorganic compound gas including an N—H bond, an inert gas, a mixed gas of $N_2$ and $H_2$, an $H_2O$ gas, or a mixed gas of $H_2$ and $O_2$ may be used.

In a case where the protective film PR has an organic film formed by MLD, an isocyanate, a carboxylic acid, or a carboxylic acid halide may be used as the precursor gas, and an amine or a compound including a hydroxyl group may be used as the modifying gas. Alternatively, a carboxylic acid anhydride may be used as the precursor gas, and an amine may be used as the modifying gas. Alternatively, bisphenol A may be used as the precursor gas, and diphenyl carbonate or epichlorohydrin may be used as the modifying gas.

In a case where the protective film PR has a metal-containing film formed by ALD or MLD, a gas containing a metal such as Ti, Ta, Ru, Al, Hf, or Sn or a metal-containing gas such as a gas containing an oxide, a nitride, a sulfide, or a halide of these metals may be used as the precursor gas. As the modifying gas, an oxidizing gas or a reducing gas such as a hydrogen-containing gas ($H_2$ or the like), an oxygen-containing gas ($O_2$ or the like), a mixed gas of $H_2$ and $N_2$, or a gas containing hydrogen and nitrogen ($NH_3$ or the like) may be used.

After Step ST2, Step ST12 may be performed to remove the protective film PR formed on the bottom portion of the recess RS of the mask MK. Step ST12 may be performed before Step ST3. For example, in a case where the protective film PR is a silicon-containing film, in Step ST12, the protective film PR formed on the bottom portion of the recess RS may be removed by plasma generated from a fluorine-containing gas. For example, in a case where the protective film PR is an organic film, in Step ST12, the protective film PR formed on the bottom portion of the recess RS may be removed by an $O_2$ gas or an $H_2$ gas.

(Step ST3)

In Step ST3, the metal-containing film MF is etched. The metal-containing film MF may be etched by atomic layer etching (ALE). Step ST3 includes Steps ST31 and ST32. Step ST32 is performed after Step ST31. In Step ST3, Steps ST31 and ST32 may be alternately repeated.

(Step ST31)

Figure 6:
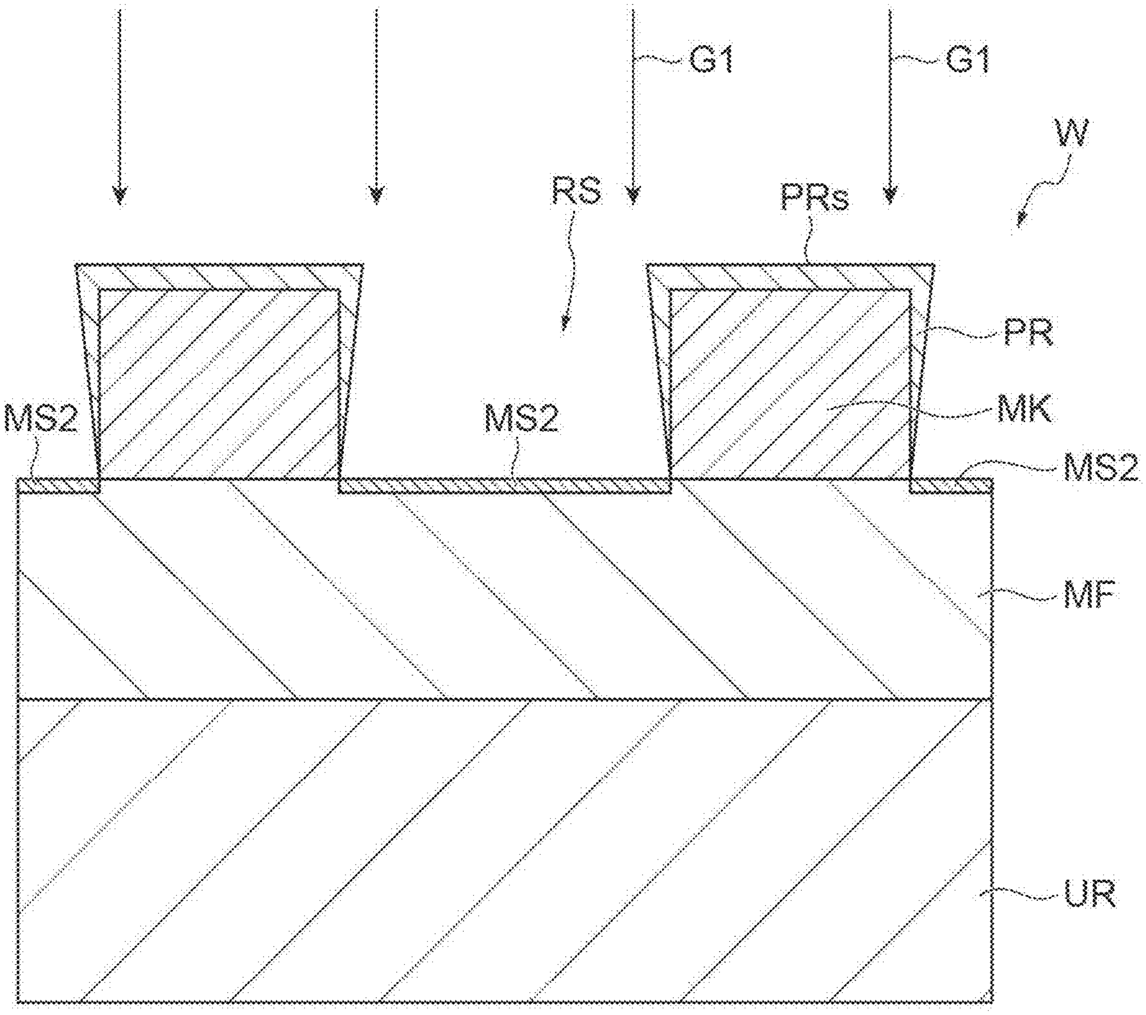
FIG. 6 is a partially enlarged sectional view of the exemplary substrate in forming a second metal-containing substance.

FIG. 6 is a partially enlarged sectional view of the exemplary substrate in forming a second metal-containing substance. In Step ST31, a second metal-containing substance MS2 is formed from a first metal-containing substance MS1 (see FIG. 5) contained in the metal-containing film MF by using a first processing gas G1 including a fluorine-containing gas. The first metal-containing substance MS1 may be positioned on the surface of the metal-containing film MF. The first processing gas G1 etches the protective film PR, so that the protective film PR on the metal-containing film MF is removed while the protective film PR on the mask MK is thinned. Thus, the surface of the metal-containing film MF is exposed to the first processing gas G1. As a result, the first metal-containing substance MS1 reacts with the first processing gas G1. The first processing gas G1 is supplied from the gas supply 20 into the plasma processing chamber 10. In the plasma processing chamber 10, the substrate W is exposed to the first processing gas G1.

The fluorine-containing gas may include at least one of a hydrogen fluoride gas (HF gas), a fluorocarbon gas, a nitrogen-containing gas, or a sulfur-containing gas. The fluorocarbon gas may include at least one of a $C_4F_6$ gas, a $C_4F_8$ gas, a $C_3F_8$ gas, or a $CF_4$ gas. The nitrogen-containing gas may include an $NF_3$ gas. The sulfur-containing gas may include an $SF_6$ gas.

The examples of the first metal-containing substance MS1 are the same as the examples of the constituent materials of the metal-containing film MF. The second metal-containing substance MS2 may be generated by the reaction between the first metal-containing substance MS1 and the fluorine-containing gas. The second metal-containing substance MS2 may contain the same metal as the metal contained in the first metal-containing substance MS1 and fluorine. The second metal-containing substance MS2 is, for example, a metal fluoride. In one example, the first metal-containing substance MS1 includes an aluminum oxide and the fluorine-containing gas includes a hydrogen fluoride gas. In this case, the second metal-containing substance MS2 includes an aluminum fluoride.

In Step ST31, a surface PRs of the protective film PR may be fluorinated by the reaction between the surface PRs of the protective film PR and the fluorine-containing gas. As a result, fluorine may remain on the surface PRs of the protective film PR.

In Step ST31, the first processing gas G1 may be used without generating plasma, or plasma generated from the first processing gas G1 may be used. In a case where no plasma is generated, the first processing gas G1 may include a hydrogen fluoride gas.

In Step ST31, the substrate W may be heated. The temperature of the substrate support 11 may be 100° C. or higher, 150° C. or higher, or 200° C. or higher. The temperature of the substrate support 11 may be 450° C. or lower. The heating may be performed by plasma generated in the plasma processing chamber 10 or the temperature adjusting module in the substrate support 11. The heating accelerates the reaction between the first metal-containing substance MS1 and the fluorine-containing gas.

After Step ST31, a purge step may be performed. In the purge step, a purge gas is supplied into the plasma processing chamber 10, and then exhausted. The purge gas is, for example, an inert gas such as nitrogen or argon.

(Step ST32)

Figure 7:
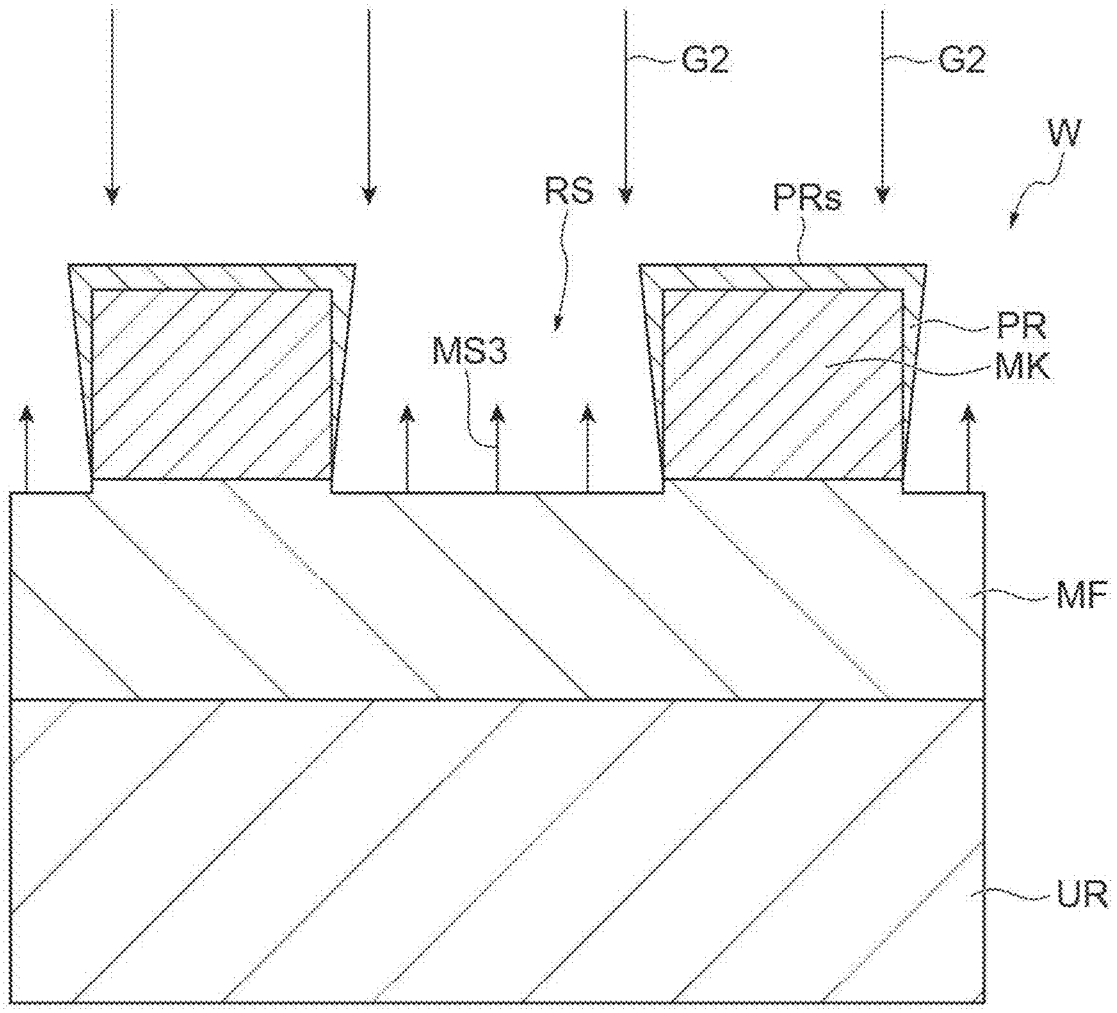
FIG. 7 is a partially enlarged sectional view of the exemplary substrate in removing the second metal-containing substance.

FIG. 7 is a partially enlarged sectional view of the exemplary substrate in removing the second metal-containing substance. In Step ST32, the second metal-containing substance MS2 is removed by using a second processing gas G2 including a precursor. The second processing gas G2 is supplied from the gas supply 20 into the plasma processing chamber 10. In Step ST32, the second processing gas G2 may be used without generating plasma. In the plasma processing chamber 10, the substrate W is exposed to the second processing gas G2.

The precursor may include a metal-containing precursor. The metal-containing precursor may include a metal complex. The metal complex may be a complex including a monodentate ligand or a chelate. The monodentate ligand may be at least one of an alkyl, a hydride, a carbonyl, a halide, an alkoxide, an alkylamide, or a silylamide. The chelate may be at least one of β-diketonate, amidinate, acetamidinate, β-diketiminate, diaminoalkoxide, or metallocene. The β-diketonate may be at least one of acetylacetonate (acac), hexafluoroacetylacetonate (hfac), trifluoroacetylacetonate (tfac), or tetramethylheptanedionate (tmhd).

The metal contained in the metal-containing precursor may be at least one of Sn, Ge, Al, B, Ga, In, Zn, Ni, Pb, Si, Hf, Zr, or Ti.

The precursor may include a metal-free precursor. The metal-free precursor may include a carbon-containing precursor. The carbon-containing precursor may be at least one of alcohol, β-diketone, amidine, acetamidine, or β-diketimine. The β-diketone may be at least one of acetylacetone (acac), hexafluoroacetylacetone (hfac), trifluoroacetylacetone (tfac), or tetramethylheptanedione (tmhd)

In Step ST32, a volatile third metal-containing substance MS3 may be generated by the reaction between the second metal-containing substance MS2 and the precursor. Accordingly, the second metal-containing substance MS2 is removed. In a case where the precursor includes a metal-containing precursor, the metal-containing precursor can react with the second metal-containing substance with low energy. In a case where the metal-containing precursor includes a metal complex, due to a ligand exchange reaction between the second metal-containing substance MS2 and the metal complex, another highly volatile metal complex is generated. In one example, the second metal-containing substance MS2 includes an aluminum fluoride, and the metal-containing precursor includes tin (II) acetylacetonate ($Sn(acac)_2$). In a case where the precursor includes a metal-free precursor, metal residue due to the reaction between the second metal-containing substance and the precursor is hardly generated. In a case where the metal-free precursor includes a carbon-containing precursor, residue containing a carbon compound is generated. The residue containing a carbon compound may be relatively easily removed.

Similarly to Step ST31, the substrate W may be heated in Step ST32. The heating accelerates the reaction between the second metal-containing substance MS2 and the precursor.

After Step ST32, a purge step may be performed in the same manner as the purge step that is performed after Step ST31.

(Step ST4)

Figure 8:
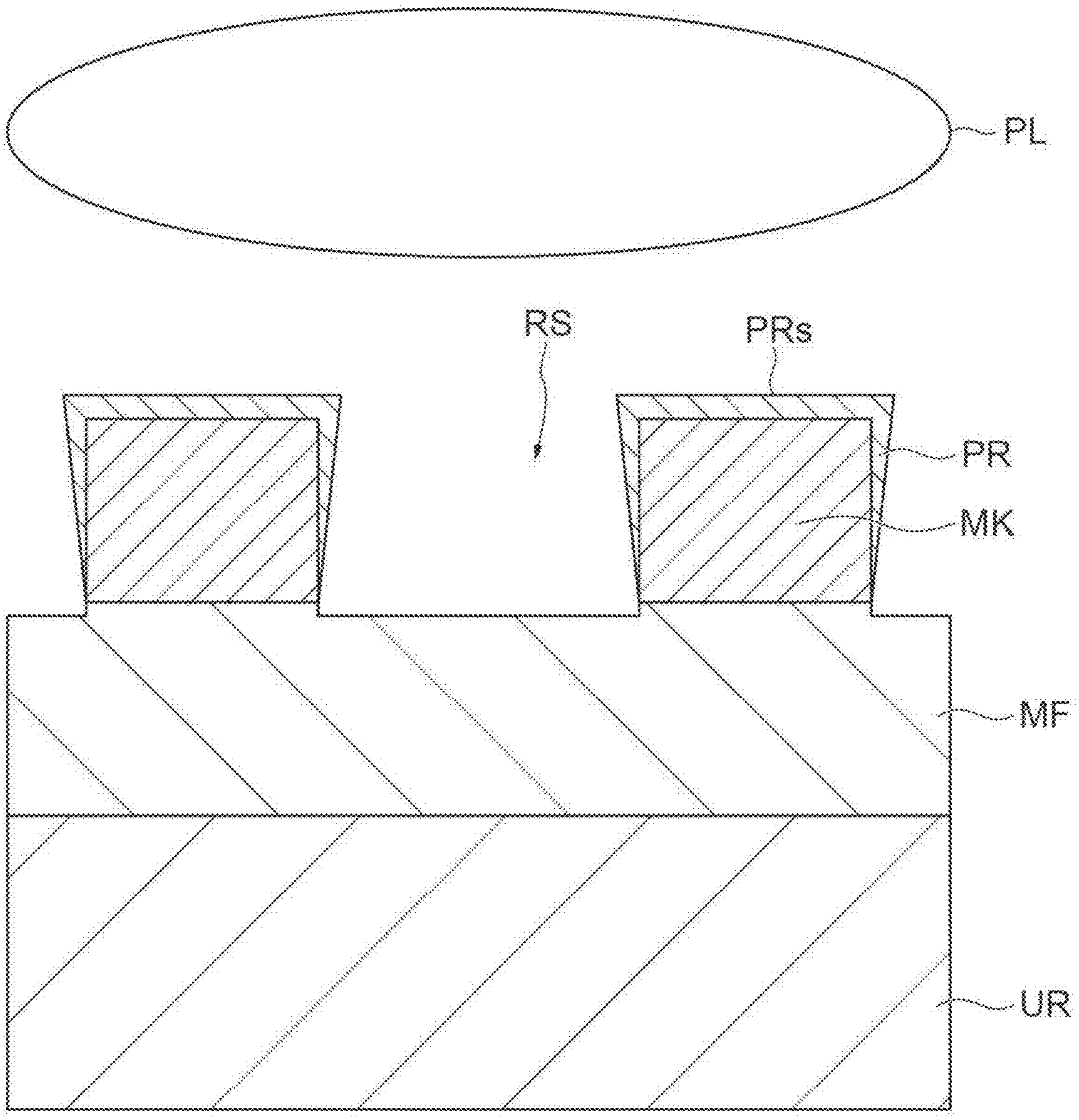
FIG. 8 is a partially enlarged sectional view of the exemplary substrate in modifying a surface of the protective film.

FIG. 8 is a partially enlarged sectional view of the exemplary substrate in modifying the surface of the protective film. In Step ST4, the surface PRs of the protective film PR is modified. In Step ST4, the fluorine on the surface PRs of the protective film PR is removed by using a third processing gas. In the present embodiment, plasma PL generated from the third processing gas is used in Step ST4. The plasma PL may be generated by the plasma generator 12 from the third processing gas supplied from the gas supply 20 into the plasma processing chamber 10. In the plasma processing chamber 10, the substrate W is exposed to the plasma PL. The third processing gas may be used without generating plasma.

In a case where the protective film PR contains silicon, an Si—F bond may remain in the surface PRs of the protective film PR after Step ST31. In this case, in a case where plasma PL generated from a third processing gas including an oxygen-containing gas is used, the fluorine atom in the surface PRs of the protective film PR is substituted with an OH group. As a result, an Si—OH bond is formed in the surface PRs of the protective film PR. In a case where plasma PL generated from a third processing gas including a hydrogen-containing gas is used, the fluorine atom in the surface PRs of the protective film PR is substituted with a hydrogen atom. As a result, an Si—H bond is formed in the surface PRs of the protective film PR. In a case where plasma PL generated from a third processing gas including a nitrogen-containing gas is used, the fluorine atom in the surface PRs of the protective film PR is substituted with a nitrogen atom. As a result, an Si—N bond is formed in the surface PRs of the protective film PR.

In a case where the protective film PR contains carbon, a C—F bond may be present in the surface PRs of the protective film PR after Step ST31. In this case, in a case where plasma PL generated from a third processing gas including an oxygen-containing gas or a hydrogen-containing gas is used, the fluorine atom in the surface PRs of the protective film PR is substituted with an H group. As a result, a C—H bond is formed in the surface PRs of the protective film PR. This is because the generated carbon monoxide volatilizes. In a case where plasma PL generated from a third processing gas including a nitrogen-containing gas is used, the fluorine atom in the surface PRs of the protective film PR is substituted with a nitrogen atom. As a result, a C—N bond is formed in the surface PRs of the protective film PR. Alternatively, in a case where plasma PL generated from a third processing gas including a nitrogen-containing gas is used, the surface PRs of the protective film PR is scraped. As a result, in the surface PRs of the protective film PR, the constituent materials of the protective film PR is exposed. In a case where the constituent materials include a C—H bond, in the surface PRs of the protective film PR, the C—H bond is exposed.

(Step ST5)

In Step ST5, Steps ST2, ST3, and ST4 are repeated. Steps ST2, ST3, and ST4 may be repeated a plurality of times. The etching depth of the metal-containing film MF can be increased through Step ST5.

According to the method MT1 described above, etching of the mask MK is suppressed by the protective film PR during etching of the metal-containing film MF. Therefore, the metal-containing film MF can be selectively etched with respect to other films Furthermore, the fluorine on the surface PRs of the protective film PR is removed through Step ST4. In a case where the fluorine remains on the surface PRs of the protective film PR, the time until the start of the deposition of the protective film PR tends to become longer. In the method MT1 described above, since the fluorine on the surface PRs of the protective film PR is removed in Step ST4, a further protective film PR can be formed in a short time thereafter.

In Step ST2, in a case where the thickness of the protective film PR formed on the side surface MKs of the mask MK decreases toward the metal-containing film MF from the upper surface MKt of the mask MK, the thickness of the protective film PR formed on the metal-containing film MF decreases. Therefore, the protective film PR on the metal-containing film MF can be removed in a short time, and thus the etching rate of the metal-containing film MF is improved.

Although the various exemplary embodiments have been described above, various additions, omissions, substitutions, and changes may be made without being limited to the exemplary embodiments described above. In addition, elements in different embodiments can be combined to form other embodiments. Hereinafter, examples of other embodiments will be described, but the same processes and the like as in the above-described exemplary embodiments will be omitted or simplified.

Another Embodiment 1

The substrate processing apparatus may not include the plasma generator 12. In this case, the plasma processing is not performed in the chamber of the substrate processing apparatus. The method MT1 can also be performed using such a substrate processing apparatus.

Another Embodiment 2

The first processing gas G1 may include a halogen-containing gas. For example, the first processing gas G1 may include at least one of a chlorine-containing gas or a bromine-containing gas instead of or together with the above-described fluorine-containing gas. The chlorine-containing gas may include at least one of a chlorine ($Cl_2$) gas or a hydrogen chloride (HCl) gas. The bromine-containing gas may include at least one of a bromine ($Br_2$) gas or a hydrogen bromide (HBr) gas. In a case where the plasma is generated from the first processing gas G1 in Step ST31, the halogen-containing gas may contain at least one of silicon or carbon.

In a case where the first processing gas G1 includes a halogen-containing gas, the second metal-containing substance MS2 generated in Step ST31 may be formed by the reaction between the first metal-containing substance MS1 and the halogen-containing gas. The second metal-containing substance MS2 may contain the same metal as the metal contained in the first metal-containing substance MS1 and halogen. The second metal-containing substance MS2 is, for example, a metal halide. Specifically, the second metal-containing substance MS2 may be a metal fluoride, a metal chloride, or a metal bromide. Even in a case where the second metal-containing substance MS2 is a metal halide (a metal chloride or a metal bromide) other than a metal fluoride, the second metal-containing substance MS2 can be removed by the second processing gas G2 including the precursor described above.

Another Embodiment 3

The first processing gas G1 may include an oxygen-containing gas instead of or together with the halogen-containing gas. For example, the first processing gas G1 may include at least one of an oxygen ($O_2$) gas, a carbon monoxide (CO) gas, or a carbon dioxide gas ($CO_2$) as the oxygen-containing gas.

In a case where the first processing gas G1 includes an oxygen-containing gas, the second metal-containing substance MS2 generated in Step ST31 may be formed by the reaction between the first metal-containing substance MS1 and the oxygen-containing gas. The second metal-containing substance MS2 may contain the same metal as the metal contained in the first metal-containing substance MS1 and oxygen. The second metal-containing substance MS2 is, for example, a metal oxide. In a case where the second metal-containing substance MS2 is a metal oxide, the second metal-containing substance MS2 can be removed by the second processing gas G2 including the metal-free precursor described above.

Another Embodiment 4

Figure 9:
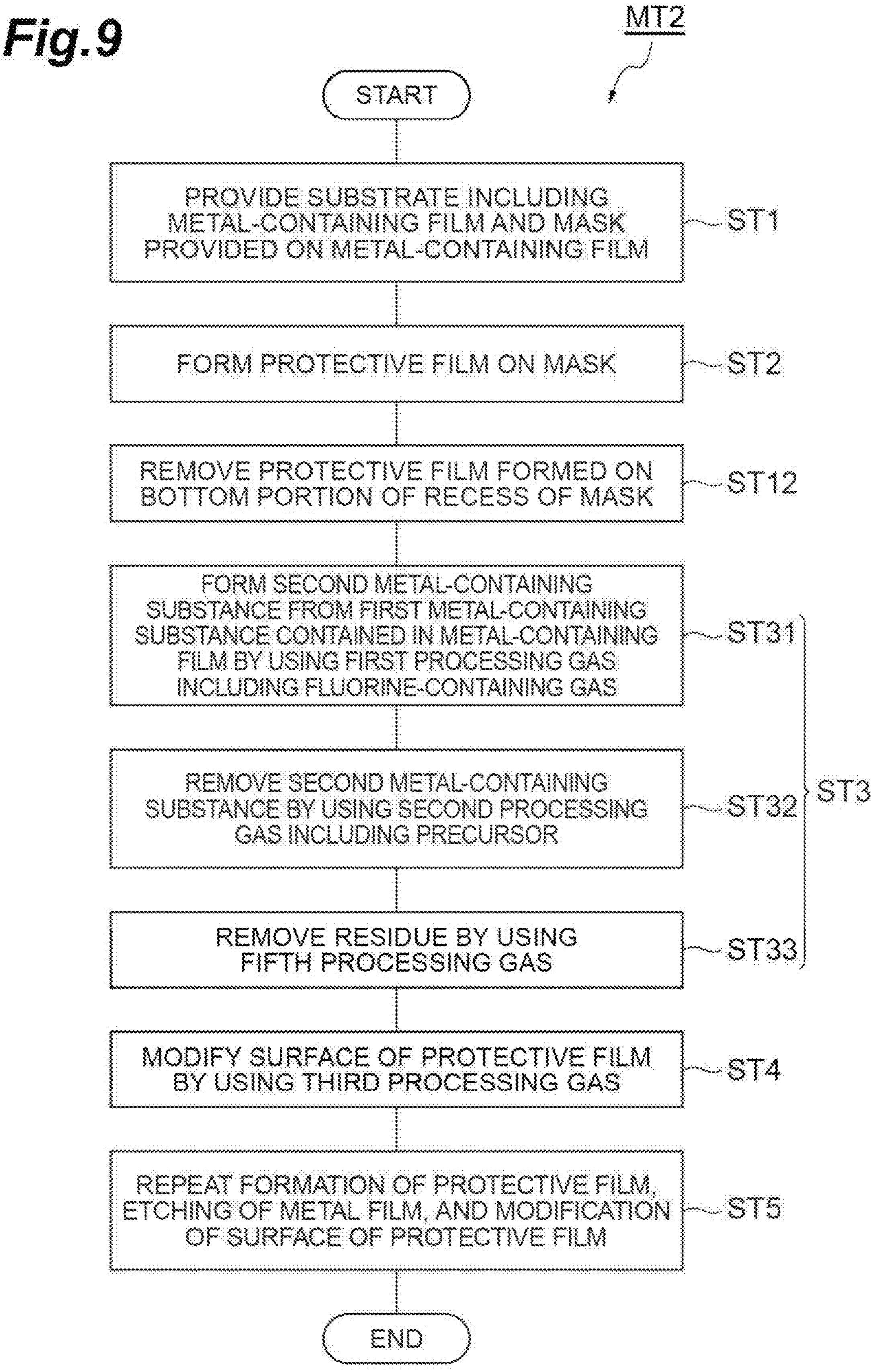
FIG. 9 is a flowchart of a substrate processing method according to one exemplary embodiment.

FIG. 9 is a flowchart of a substrate processing method according to Another Embodiment 4. Similarly to the method MT1, the substrate processing method shown in FIG. 9 (hereinafter, referred to as "method MT2") may include Steps ST1 to ST5. The method MT2 includes Step ST33 after Step ST32 and before Step ST4. Step ST33 is exposing the substrate W to plasma generated from a fifth processing gas including at least one of a fluorine-containing gas, an oxygen-containing gas, a hydrogen-containing gas, or a nitrogen-containing gas. The fluorine-containing gas may include at least one of a fluorocarbon gas, a nitrogen-containing gas, or a sulfur-containing gas. The fluorocarbon gas may include at least one of a $C_4F_6$ gas, a $C_4F_8$ gas, a $C_3F_8$ gas, or a $CF_4$ gas. The nitrogen-containing gas may include an $NF_3$ gas. The sulfur-containing gas may include an $SF_6$ gas. The oxygen-containing gas may include at least one of an oxygen gas, a carbon monoxide gas, or a carbon dioxide gas. The hydrogen-containing gas may include a hydrogen gas. The nitrogen-containing gas may include a nitrogen gas. In a case where the precursor used in Step ST32 contains Sn, the fifth processing gas may include at least one of a hydrogen gas, a $CH_4$ gas, or a carbon monoxide gas. In a case where the precursor used in Step ST32 contains Si, Ge, or B, the fifth processing gas may include a fluorine-containing gas. In a case where the precursor used in Step ST32 contains Pb, Ni, Al, Zn, Hf, or Zr, the fifth processing gas may include at least one of a $CH_4$ gas or a carbon monoxide gas. In a case where the precursor used in Step ST32 includes a metal-free precursor, the fifth processing gas may include at least one of a hydrogen gas or an oxygen gas.

According to the method MT2 described above, the residue (for example, a residual material derived from the precursor) present on the substrate W after removal of the second metal-containing substance MS2 can be removed.

Another Embodiment 5

Figure 10:
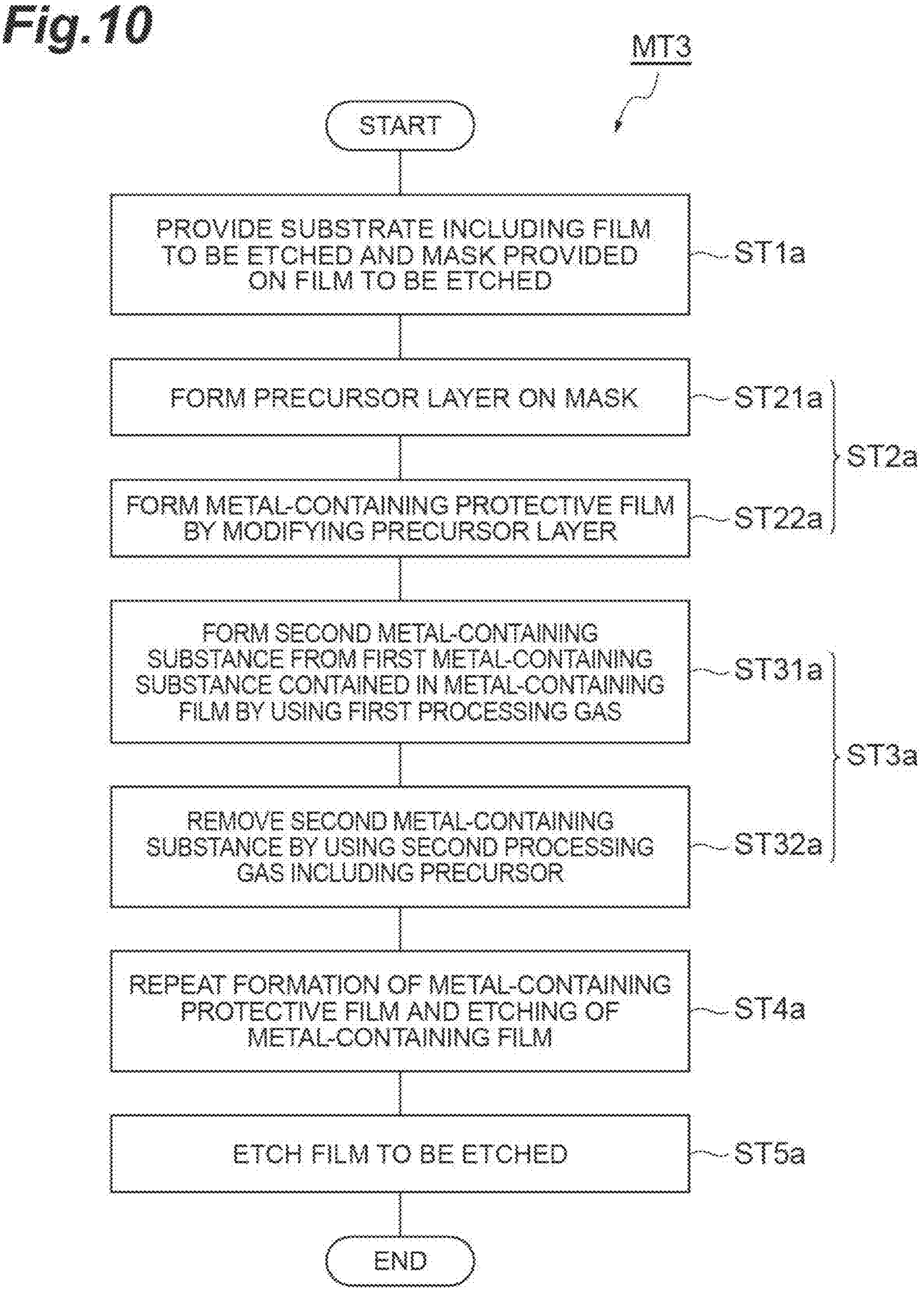
FIG. 10 is a flowchart of a substrate processing method according to one exemplary embodiment.

The present embodiment is not limited to the metal-containing film MF and can be applied to the etching of a metal-containing film. FIG. 10 is a flowchart of a substrate processing method according to Another Embodiment 5. The substrate processing method shown in FIG. 10 (hereinafter, referred to as "method MT3") may include Steps ST1*a* to ST5*a*. Steps ST1*a* to ST5*a* may be executed in order. The method MT3 may not include Step ST4*a*.

(Step ST1*a*)

Figure 11:
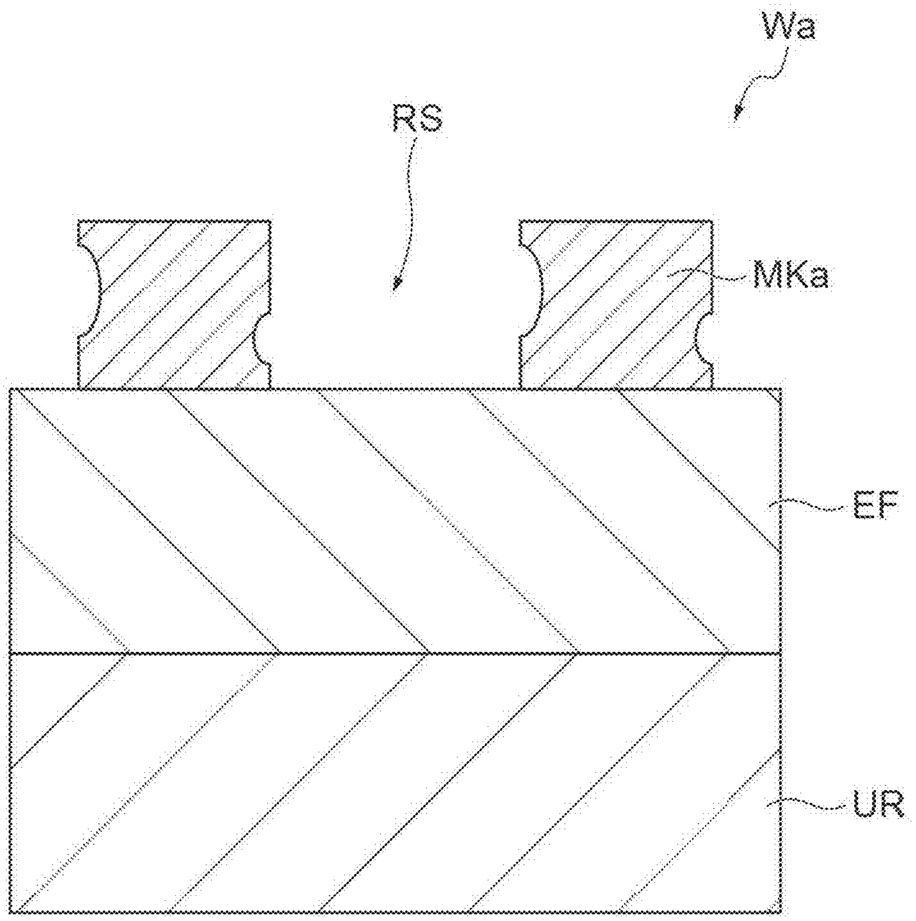
FIG. 11 is a partially enlarged sectional view of an exemplary substrate.

In Step ST1*a*, a substrate Wa shown in FIG. 11 is provided. The substrate Wa includes a film EF to be etched and a mask MKa. The substrate Wa may further include a base region UR below the film EF to be etched. The film EF to be etched may be a silicon-containing film. The film EF to be etched may be at least one of a silicon oxide film, a silicon nitride film, or a polysilicon film, or may be a laminated film including two or more of these films.

The mask MKa may include at least one recess RS. The mask MKa may contain silicon. The mask MKa may contain at least one of a silicon oxide or a silicon nitride. The mask MKa may contain carbon (organic matter). The mask MKa may contain at least one of photoresist, spin-on carbon, amorphous carbon, or tungsten carbide. The mask MKa may contain a metal. The mask MKa may contain at least one of tin (Sn), tellurium (Te), antimony (Sb), indium (In), silver (Ag), titanium (Ti), chromium (Cr), cobalt (Co), nickel (Ni), copper (Cu), zinc (Zn), germanium (Ge), or hafnium (Hf). The mask MKa may contain an oxide of Sn or a hydroxide of Sn.

(Step ST2*a*)

Figure 12:
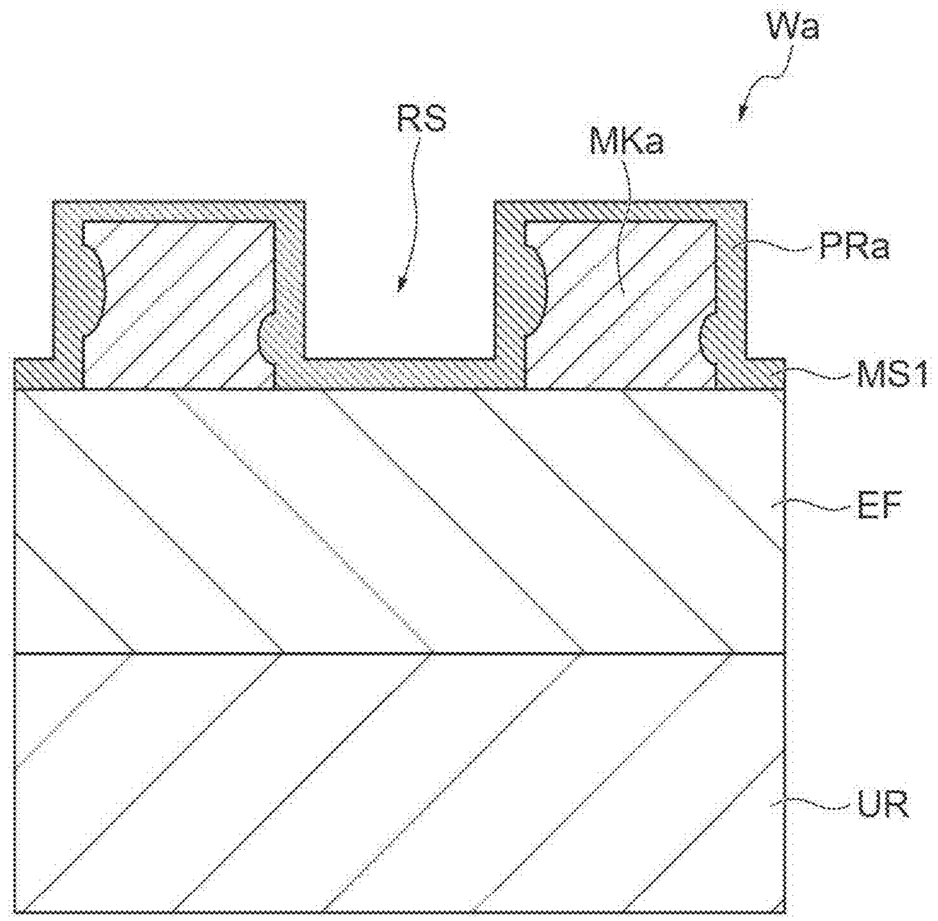
FIG. 12 is a partially enlarged sectional view of the exemplary substrate in forming a metal-containing protective film on a mask.

In Step ST2*a*, a metal-containing protective film PRa shown in FIG. 12 is formed on the mask MKa. The metal-containing protective film PRa may be formed by atomic layer deposition (ALD), molecular layer deposition (MLD), or chemical vapor deposition (CVD). The metal-containing protective film PRa may be a conformal film or a sub-conformal film. In a bottom portion of a recess RS of the mask MKa, the metal-containing protective film PRa may not be formed on the film EF to be etched.

In a case where the metal-containing protective film PRa is formed by ALD or MLD, Step ST2*a* may include Steps ST21*a* and ST22*a*. Step ST22*a* is performed after Step ST21*a*. In Step ST2*a*, Steps ST21*a* and ST22*a* may be alternately repeated.

(Step ST21*a*)

In Step ST21*a*, a precursor layer is formed on the mask MKa by using a gas of a first precursor containing a metal.

The precursor layer may be formed on a side surface of the mask MKa. The precursor layer may be formed or may not be formed on an upper surface of the mask MKa. The precursor layer may be formed or may not be formed on the bottom portion of the recess RS of the mask MKa. As the gas of the first precursor, a gas containing a metal such as Ti, Ta, Ru, Al, Hf, or Sn or a metal-containing gas such as a gas containing an oxide, a nitride, a sulfide, or a halide of these metals may be used.

(Step ST22*a*)

In Step ST22*a*, by using a modifying gas including an oxidizing gas or a reducing gas, the precursor layer is modified to form the metal-containing protective film PRa. As the modifying gas, an oxidizing gas or a reducing gas such as a hydrogen-containing gas ($H_2$ or the like), an oxygen-containing gas ($O_2$ or the like), a mixed gas of $H_2$ and $N_2$, or a gas containing hydrogen and nitrogen ($NH_3$ or the like) may be used.

(Step ST3*a*)

In Step ST3*a*, a part of the metal-containing protective film PRa is etched. The remaining part of the metal-containing protective film PRa is not etched. A part of the metal-containing protective film PRa may be etched by atomic layer etching (ALE). Step ST3*a* includes Steps ST31*a* and ST32*a*. Step ST32*a* is performed after Step ST31*a*. In Step ST3*a*, Steps ST31*a* and ST32*a* may be alternately repeated.

(Step ST31*a*)

Figure 13:
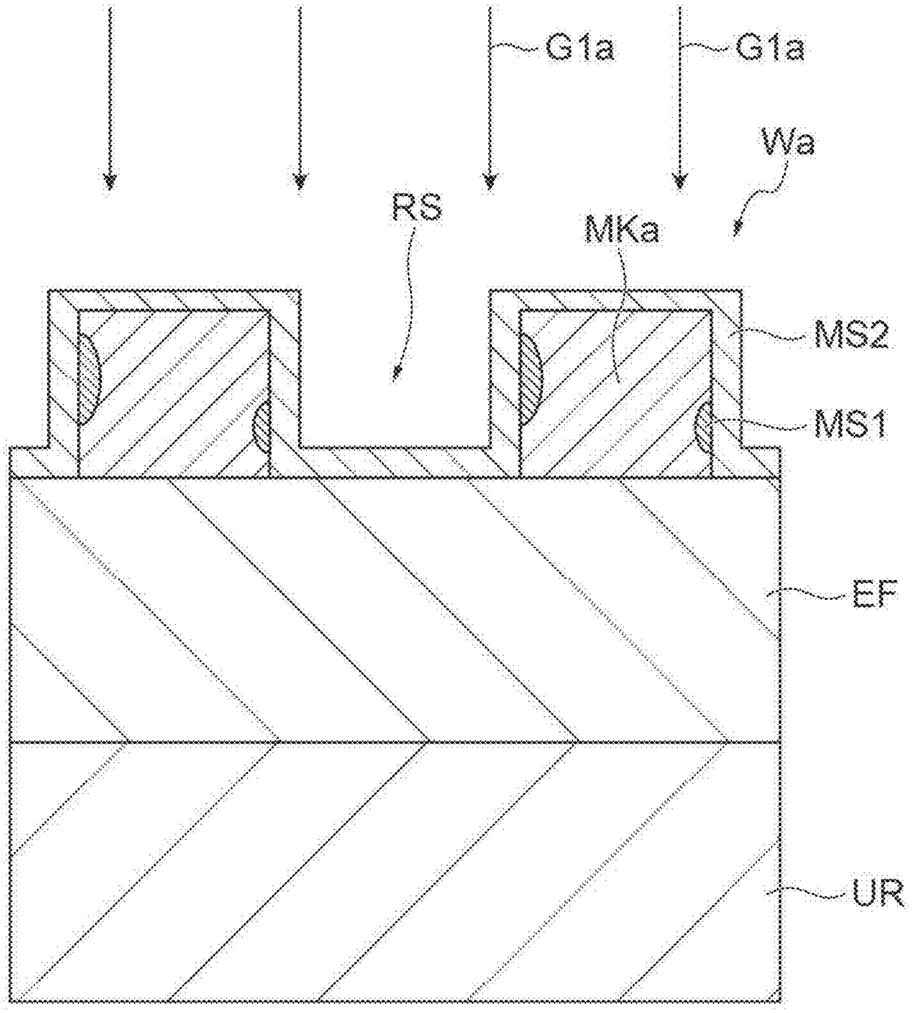
FIG. 13 is a partially enlarged sectional view of the exemplary substrate in forming a second metal-containing substance.

In Step ST31*a*, as shown in FIG. 13, a second metal-containing substance MS2 is formed from a first metal-containing substance MS1 contained in the metal-containing protective film PRa by using a first processing gas G1*a* including at least one of a halogen-containing gas or an oxygen-containing gas. As the first processing gas G1*a*, the same gas as the first processing gas G1 can be used. The first metal-containing substance MS1 filling the recesses occurring due to the surface roughness of the mask MKa may not react with the first processing gas G1*a*.

(Step ST32*a*)

Figure 14:
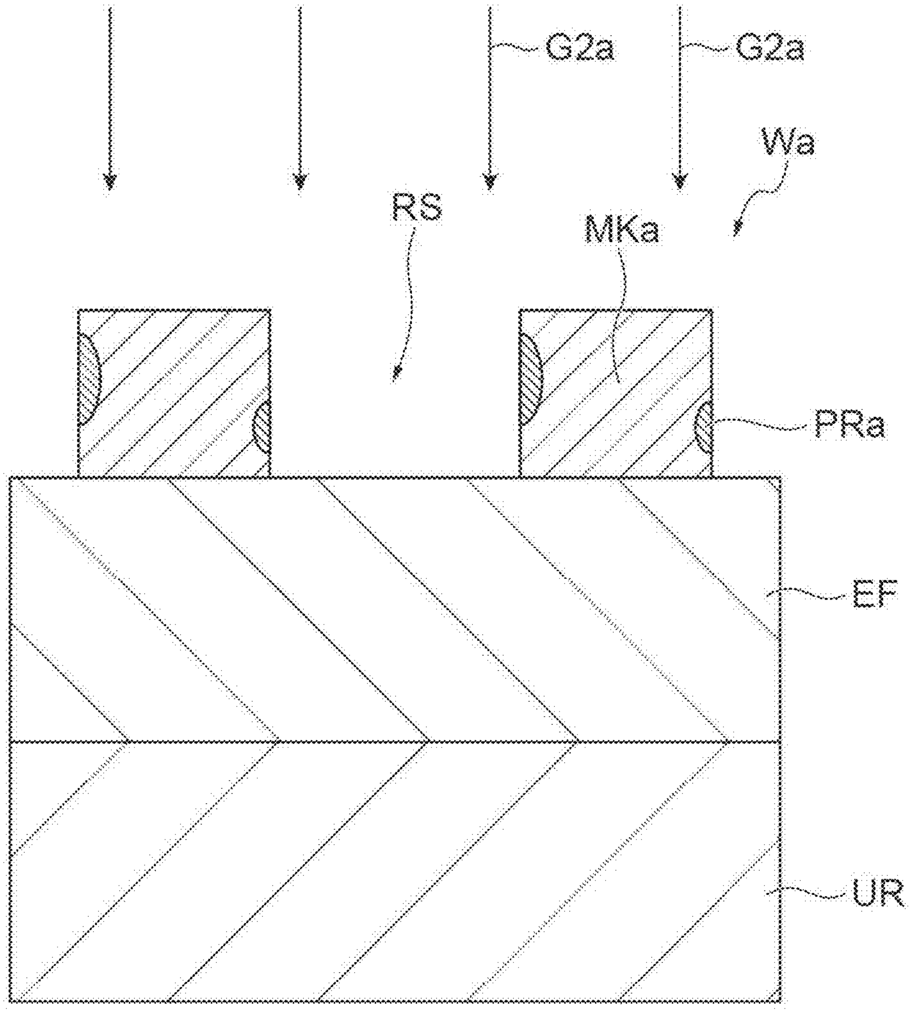
FIG. 14 is a partially enlarged sectional view of the exemplary substrate in removing the second metal-containing substance.

In Step ST32*a*, as shown in FIG. 14, the second metal-containing substance MS2 is removed by using a second processing gas G2*a* including a second precursor. As the second precursor, the same precursor as the precursor included in the second processing gas G2 can be used.

(Step ST4*a*)

In Step ST4*a*, Steps ST2*a* and ST3*a* are repeated. Steps ST2*a* and ST3*a* may be repeated a plurality of times. The etching amount of the metal-containing protective film PRa can be controlled by the number of times of repetition of Steps ST2*a* and ST3*a*.

(Step ST5*a*)

In Step ST5*a*, the film EF to be etched is etched via the recess RS (opening) of the mask MKa on which the metal-containing protective film PRa is formed. The film EF to be etched may be etched by plasma generated from a sixth processing gas. For example, in a case where the film EF to be etched is a silicon-containing film, the sixth processing gas may include a fluorine-containing gas. The fluorine-containing gas may include at least one of a hydrogen fluoride gas (HF gas), a fluorocarbon gas, or a hydrofluorocarbon gas.

According to the method MT3, in Step ST3*a*, the metal-containing protective film PRa can be etched with a high selectivity with respect to the film EF to be etched and the mask MKa. Further, according to the method MT3, in a case where the mask MKa has a large surface roughness, the surface roughness of the mask MKa can be improved.

From the above description, it will be understood that various embodiments of the present disclosure have been described herein for purposes of description, and that various modifications may be made without departing from the scope and spirit of the present disclosure. Accordingly, the various embodiments disclosed herein are not intended to be limiting, with the true scope and spirit being indicated by the aspects following claims.

Here, the various exemplary embodiments included in the present disclosure are described in (Supplementary Note 1) to (Supplementary Note 24) below.

(Supplementary Note 1)

A substrate processing method including:

(a) providing a substrate including a metal-containing film and a mask provided on the metal-containing film;

(b) forming a protective film on the mask; and (c) etching the metal-containing film after (b), in which (c) includes (c1) forming a second metal-containing substance from a first metal-containing substance contained in the metal-containing film by using a first processing gas including a fluorine-containing gas, and (c2) removing the second metal-containing substance by using a second processing gas including a precursor.

(Supplementary Note 2)

The method according to Supplementary Note 1, further including (d) removing fluorine on a surface of the protective film by using a third processing gas after (c).

(Supplementary Note 3)

The method according to Supplementary Note 2, further including (e) repeating (b), (c), and (d) after (d).

(Supplementary Note 4)

The method according to any one of Supplementary Notes 1 to 3, in which in (b), a thickness of the protective film formed on a side surface of the mask decreases toward the metal-containing film from an upper surface of the mask.

(Supplementary Note 5)

The method according to Supplementary Note 2, in which in (d), plasma generated from the third processing gas is used and the third processing gas includes at least one of an oxygen-containing gas, a hydrogen-containing gas, or a nitrogen-containing gas.

(Supplementary Note 6)

The method according to any one of Supplementary Notes 1 to 5, in which the protective film contains at least one of silicon, carbon, or a metal.

(Supplementary Note 7)

The method according to any one of Supplementary Notes 1 to 6, in which in (c1), the first processing gas is used without generating plasma.

(Supplementary Note 8)

The method according to any one of Supplementary Notes 1 to 6, in which in (c1), plasma generated from the first processing gas is used.

(Supplementary Note 9)

The method according to any one of Supplementary Notes 1 to 8, in which in at least one of (c1) or (c2), the substrate is heated.

(Supplementary Note 10)

The method according to any one of Supplementary Notes 1 to 9, in which the precursor includes a metal-containing precursor.

(Supplementary Note 11)

The method according to Supplementary Note 10, in which the metal-containing precursor includes a metal complex.

(Supplementary Note 12)

The method according to Supplementary Note 11, in which the metal complex is a complex including at least one monodentate ligand selected from the group consisting of an alkyl, a hydride, a carbonyl, a halide, an alkoxide, an alkylamide, and a silylamide, or at least one chelate selected from the group consisting of β-diketonate, amidinate, acetamidinate, β-diketiminate, diaminoalkoxide, and metallocene.

(Supplementary Note 13)

The method according to any one of Supplementary Notes 10 to 12, in which a metal contained in the metal-containing precursor is at least one selected from the group consisting of Sn, Ge, Al, B, Ga, In, Zn, Ni, Pb, Si, Hf, Zr, and Ti.

(Supplementary Note 14)

The method according to any one of Supplementary Notes 1 to 13, in which the precursor includes a metal-free precursor.

(Supplementary Note 15)

The method according to Supplementary Note 14, in which the metal-free precursor is at least one β-diketone selected from the group consisting of acetylacetone (acac), hexafluoroacetylacetone (hfac), trifluoroacetylacetone (tfac), and tetramethylheptanedione (tmhd).

(Supplementary Note 16)

The method according to any one of Supplementary Notes 1 to 15, in which the metal-containing film contains at least one metal selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, and Sn.

(Supplementary Note 17)

The method according to Supplementary Note 16, in which the metal-containing film is an oxide or a nitride of the metal.

(Supplementary Note 18)

The method according to any one of Supplementary Notes 1 to 17, in which the fluorine-containing gas includes at least one selected from the group consisting of a hydrogen fluoride gas, a fluorocarbon gas, a nitrogen-containing gas, and a sulfur-containing gas.

(Supplementary Note 19)

A substrate processing method including:

(a) providing a substrate including a film to be etched and a mask provided on the film to be etched;

(b) forming a metal-containing protective film on the mask;

(c) removing a part of the metal-containing protective film after (b); and (d) etching the film to be etched after (c), in which (b) includes (b1) forming a precursor layer on a side surface of the mask by using a first precursor containing a metal, and (b2) modifying the precursor layer into the metal-containing protective film by using a modifying gas including an oxidizing gas or a reducing gas, and (c) includes (c1) forming a second metal-containing substance from a first metal-containing substance contained in the metal-containing protective film by using a first processing gas including at least one of a halogen-containing gas or an oxygen-containing gas, and (c2) removing the second metal-containing substance by using a second processing gas including a second precursor.

(Supplementary Note 20)

The method according to Supplementary Note 19, in which the first precursor contains at least one metal selected from the group consisting of Ti, Ta, Ru, Al, Hf, and Sn.

(Supplementary Note 21)

The method according to Supplementary Note 19 or 20, in which the halogen-containing gas contains at least one selected from the group consisting of fluorine, chlorine, and bromine.

(Supplementary Note 22)

The method according to any one of Supplementary Notes 19 to 21, in which the second precursor contains a metal including at least one selected from the group consisting of Sn, Ge, Al, B, Ga, In, Zn, Ni, Pb, Si, Hf, Zr, and Ti or a complex of the metal.

(Supplementary Note 23)

The method according to any one of Supplementary Notes 19 to 22, in which the film to be etched is a silicon-containing film.

(Supplementary Note 24)

A substrate processing apparatus including:

a chamber;

a substrate support for supporting a substrate in the chamber, the substrate including a metal-containing film and a mask provided on the metal-containing film;

a gas supply configured to supply each of a first processing gas including a hydrogen fluoride gas, a second processing gas including a precursor, a third processing gas, and a fourth processing gas for forming a protective film into the chamber; and a controller, in which the controller is configured to control the gas supply in order to form the protective film on the mask by using the fourth processing gas, the controller is configured to control the gas supply in order to form a second metal-containing substance from a first metal-containing substance contained in the metal-containing film by using the first processing gas after formation of the protective film, the controller is configured to control the gas supply in order to remove the second metal-containing substance by using the second processing gas after formation of the second metal-containing substance, and the controller is configured to control the gas supply in order to remove fluorine on a surface of the protective film by using the third processing gas after removal of the second metal-containing substance.

According to one exemplary embodiment, a substrate processing method and a substrate processing apparatus in which a metal-containing film can be selectively etched with respect to other films are provided.

What is claimed is:

1. A substrate processing method comprising:

(a) providing a substrate including a metal-containing film and a mask provided on the metal-containing film;

(b) forming a protective film on the mask; and (c) etching the metal-containing film after (b), wherein (c) includes (c1) forming a second metal-containing substance from a first metal-containing substance contained in the metal-containing film by using a first processing gas including a fluorine-containing gas, and (c2) removing the second metal-containing substance by using a second processing gas including a precursor that contains at least one metal selected from the group consisting of Sn, Ge, Al, B, Ga and In.

2. The method according to claim 1, further comprising (d) removing fluorine from a surface of the protective film by using a third processing gas after (c).

3. The method according to claim 2, further comprising (e) repeating (b), (c), and (d) after (d).

4. The method according to claim 2, wherein in (d), plasma generated from the third processing gas is used and the third processing gas includes at least one of an oxygen-containing gas, a hydrogen-containing gas, and a nitrogen-containing gas.

5. The method according to claim 1, wherein in (b), the protective film is formed on a side surface of the mask and has a thickness that decreases toward the metal-containing film from an upper surface of the mask.

6. The method according to claim 1, wherein the protective film contains at least one of silicon, carbon, and a metal.

7. The method according to claim 1, wherein in (c1), the first processing gas is used without generating plasma.

8. The method according to claim 1, wherein in (c1), plasma generated from the first processing gas is used.

9. The method according to claim 1, wherein in at least one of (c1) or (c2), the substrate is heated.

10. The method according to claim 1, wherein the precursor includes a metal complex.

11. The method according to claim 10, wherein the metal complex is a complex including at least one monodentate ligand selected from the group consisting of an alkyl, a hydride, a carbonyl, a halide, an alkoxide, an alkylamide, and a silylamide, or at least one chelate selected from the group consisting of β-diketonate, amidinate, acetamidinate, β-diketiminate, diaminoalkoxide, and metallocene.

12. The method according to claim 1, wherein the precursor includes a metal-free precursor.

13. The method according to claim 12, wherein the metal-free precursor is at least one β-diketone selected from the group consisting of acetylacetone (acac), hexafluoroacetylacetone (hfac), trifluoroacetylacetone (tfac), and tetramethylheptanedione (tmhd).

14. The method according to claim 1, wherein the metal-containing film contains at least one metal selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, and Sn.

15. The method according to claim 14, wherein the metal-containing film is an oxide or a nitride of the metal.

16. The method according to claim 1, wherein the fluorine-containing gas includes at least one member selected from the group consisting of a hydrogen fluoride gas, a fluorocarbon gas, a nitrogen-containing gas, and a sulfur-containing gas.

17. A substrate processing method comprising:

(a) providing a substrate including a film to be etched and a mask provided on the film to be etched;

(b) forming a metal-containing protective film on the mask;

(c) removing a part of the metal-containing protective film after (b); and (d) etching the film to be etched after (c), wherein (b) includes (b1) forming a precursor layer on a side surface of the mask by using a first precursor containing at least one metal selected from the group consisting of Ti, Ta, Ru, Al, Hf, and Sn, and (b2) modifying the precursor layer into the metal-containing protective film by using a modifying gas including an oxidizing gas or a reducing gas, and (c) includes (c1) forming a second metal-containing substance from a first metal-containing substance contained in the metal-containing protective film by using a first processing gas including at least one of a halogen-containing gas or an oxygen-containing gas, and (c2) removing the second metal-containing substance by using a second processing gas including a second precursor.

18. The method according to claim 17, wherein the halogen-containing gas contains at least one member selected from the group consisting of fluorine, chlorine, and bromine.

19. The method according to claim 17, wherein the second precursor contains a metal including at least one member selected from the group consisting of Sn, Ge, Al, B, Ga, In, Zn, Ni, Pb, Si, Hf, Zr, and Ti or a complex of the metal.

20. The method according to claim 17, wherein the film to be etched is a silicon-containing film.

* * * * *